United States Patent [19]

Murakami et al.

[11] Patent Number: 5,241,197
[45] Date of Patent: Aug. 31, 1993

[54] TRANSISTOR PROVIDED WITH STRAINED GERMANIUM LAYER

[75] Inventors: Eiichi Murakami, Fuchu; Kiyokazu Nakagawa, Sayama; Takashi Ohshima, Fuchu; Hiroyuki Eto, Kokubunji; Masanobu Miyao, Tokorozawa, all of Japan

[73] Assignee: Hitachi, Ltd., Tokyo, Japan

[21] Appl. No.: 759,772

[22] Filed: Sep. 13, 1991

Related U.S. Application Data

[63] Continuation of Ser. No. 468,913, Jan. 23, 1990, abandoned.

[30] Foreign Application Priority Data

Jan. 25, 1989 [JP] Japan .................... 1-013915
Jun. 14, 1989 [JP] Japan .................... 1-149627

[51] Int. Cl.⁵ .................... H01L 29/161; H01L 29/20
[52] U.S. Cl. .................... 257/192; 257/616
[58] Field of Search .................... 357/16, 17, 34, 58, 357/16; 257/192, 616

[56] References Cited

U.S. PATENT DOCUMENTS

| | | | |
|---|---|---|---|
| 4,529,455 | 7/1985 | Bean et al. | 437/105 |
| 4,710,478 | 12/1987 | Yoder et al. | 357/16 |
| 4,771,326 | 9/1988 | Curran | 357/34 |
| 4,800,415 | 1/1989 | Simmons et al. | 357/16 |
| 5,019,882 | 5/1991 | Solomon et al. | 357/58 |

FOREIGN PATENT DOCUMENTS

| | | |
|---|---|---|
| 0323896A2 | 7/1989 | European Pat. Off. . |
| 0380077A3 | 8/1990 | European Pat. Off. . |
| 3811821 | 10/1988 | Fed. Rep. of Germany . |
| 60-245170 | 12/1985 | Japan . |
| 61-189620 | 8/1986 | Japan . |
| 63-252478 | 4/1987 | Japan . |
| 63-122177 | 5/1988 | Japan . |
| 63-211674 | 9/1988 | Japan . |
| 8808206 | 10/1988 | World Int. Prop. O. . |

OTHER PUBLICATIONS

Lang et al., "Measurement of the Band Gap of $Ge_x Si_{1-x}/Si$ Strained-Layer Heterostructures", Appl Phys Lett 47(12) Dec. 15, 1985, pp. 1333-1335.
IBM Technical Disclosure Bulletin, vol. 31, No. 2 (New York, NY), pp. 205-208, "Self-Aligned Mesa Transistor".
Pearsall et al., "Enhancement and Depletion Mode p-Channel $Ge_x Si_{1-x}$ Modulation Doped FET's", IEEE Electron Dev. Lett., vol. ED1 7(5) May 1986.

Primary Examiner—Jerome Jackson
Assistant Examiner—D. Monin
Attorney, Agent, or Firm—Antonelli, Terry, Stout & Kraus

[57] ABSTRACT

A transistor having a high carrier mobility and suited for a high-speed operation can be formed by utilizing a fact that the carrier mobility in a strained germanium layer is large. A strain control layer is provided beneath the germanium layer to impose a compressive strain on the germanium layer, and the composition of the strain control layer in a predetermined range is used to generate the compressive strain surely.

22 Claims, 13 Drawing Sheets

← BIP TYPE → ← MOD TYPE →

TRANSISTOR PROVIDED WITH STRAINED GERMANIUM LAYER

This application is a continuation of application Ser. No. 07/468,913, filed on Jan. 23, 1990, now abandoned.

BACKGROUND OF THE INVENTION

The present invention relates to a semiconductor device, and more particularly to a semiconductor device having a high carrier mobility.

It has been proposed to fabricate a field effect transistor (FET) using silicon or compound semi-conductive materials such as GaAs and AlGaAs in such a manner that a carrier transport channel layer is buried in a semiconductor layer. In order to form a buried channel layer, it is required to produce a potential well for confining carriers (namely, electrons or holes). As is well known, a potential well (that is, nonuniform distribution of inner potential) can be obtained by forming a heterostructure of semiconductor layers having different band structures, or by doping a semiconductor layer selectively with an impurity. An example of a buried channel due to a heterostructure is a GaAs channel layer sandwiched between GaAlAs layers which have a large band gap. In this case, electrons from doped GaAlAs layers are confined in an undoped GaAs channel layer (that is, potential well), and travel therein. Thus, a field effect transistor having such a heterostructure is usually called "double-heterostructure modulation-doped field effect transistor DH-MODFET (refer to the Japanese J. Appl. Phys. Vol. 23, No. 2, 1984, pages L61 to L63).

An example of a buried channel due to selective doping is an n-type impurity doped thin layer formed in silicon. In this case, a potential well is formed by dopant ions, and electrons are supplied from dopants. Thus, the thin doped layer can act as a channel layer. A field effect transistor having such a thin doped layer is usually called "doped-channel FET" (refer to the Japanese J. Appln. Phys. Vol. 26, No. 12, 1987, pages L1933 to L1936).

In the MODFET, no impurity ions are present in the channel layer. Accordingly, ionized impurity scattering does not occur, and a high carrier mobility can be obtained. While, in the doped-channel FET, the carrier concentration in the channel layer can be increased.

A field effect transistor using an $Si_{0.2}Ge_{0.8}$ layer as a channel layer is disclosed on pages 308 to 310 of the IEEE Electron Device Lett., Vol. DEL-7, 1986. In this field effect transistor, as shown layer 320 are successively piled on a silicon substrate 1 through heteroepitaxial growth techniques, to form a two-dimensional hole gas at a p-Si/$Si_{0.2}Ge_{0.8}$ interface. It has been confirmed that this field effect transistor operates as an MODFET. It is to be noted that the $Si_{0.2}Ge_{0.8}$ channel layer 200 has a thickness of 250 Å which is smaller than the critical thickness of a commensurately grown (under strained) $Si_{0.2}Ge_{0.8}$ layer on the silicon substrate 1.

The MODFET using a GaAs layer as the channel layer, however, has a problem due to a material property of GaAs. That is, the electron mobility in GaAs is as high as 8,600 cm²/V.sec at room temperature, but the hole mobility in GaAs is as low as 250 cm²/V.sec at room temperature. When an n-MODFET and a p-MODFET, each provided with a GaAs channel layer are fabricated to form a complementary logic circuit, the large difference in mobility between electrons and positive holes raises a problem. In the doped-channel FET, there arises the problem that electron mobility in the channel layer is reduced by impurity ion scattering therein by about one order of magnitude, as compared with the electron mobility in undoped silicon. In the MODFET of FIG. 1, the sheet carrier concentration in the channel layer is as low as $2.5 \times 10^{11}$ cm$^{-2}$, and the transconductance $g_m$ is as low as 2.5 mS/mm. This is because the band discontinuity $\Delta E_V$ at the Si/$Si_{0.8}Ge_{0.2}$ interface is as small as 0.15 eV, and thus it is impossible to confine a sufficiently large number of positive holes in the potential well. In order to improve the characteristics of this MODFET, it is necessary to make the x-value of the $Si_{1-x}Ge_x$ layer greater than or equal to 0.4, thereby making the band discontinuity $\Delta E_V$ greater than or equal to 0.3 eV. However, the critical thickness of the strained growth of an $Si_{1-x}Ge_x$ layer having an x-value greater than or equal to 0.4, on the silicon substrate is less than 200 Å, so it is very difficult to form a channel layer having a sufficient thickness by strained growth.

SUMMARY OF THE INVENTION

A transistor according to the present invention uses a high-mobility-carrier transport region as a channel or base, and this region is formed of a germanium layer having a strain. The strain of the germanium layer is controlled by a strain control layer (that is, buffer layer) provided beneath the germanium layer. Preferably, the strain control layer is formed of an $Si_{1-x}Ge_x$ layer. The strain control layer may be provided on both sides of the germanium layer. The strain of the germanium can be controlled by changing the value x of the $Si_{1-x}Ge_x$ alloyed crystal.

It is an object of the present invention to provide a high-speed switching device.

It is another object of the present invention to impose a controlled strain on a germanium layer which provides a carrier transport region.

It is a further object of the present invention to provide a high-performance, heterostructure transistor, in which a layer having large lattice mismatch is formed by strained growth while suppressing the generation of misfit dislocations.

These and other objects and many attendant advantages of the present invention will be readily appreciated and becomes better understood by reference to the following detailed description when considered in connection with the accompanying drawings.

DESCRIPTION OF THE PREFERRED EMBODIMENTS

Embodiment 1

Figure 1:
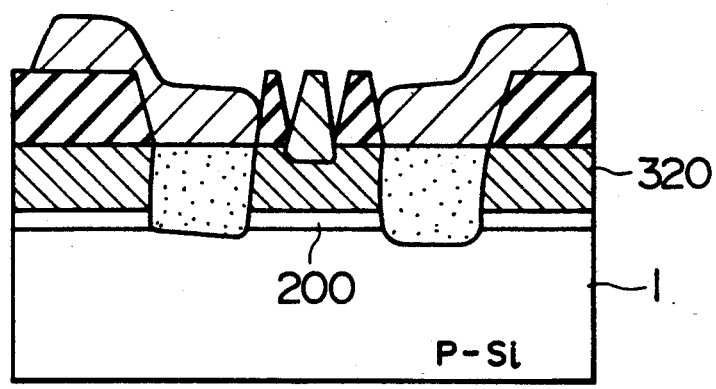
FIG. 1 is a sectional view showing conventional MODFET.
Figure 2A:
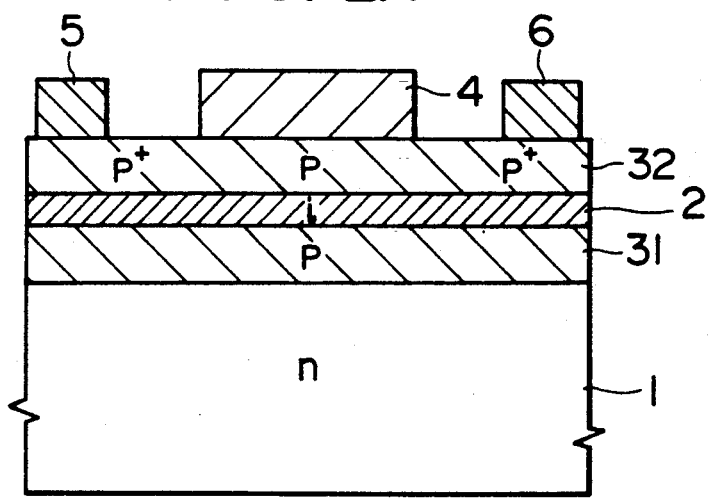
FIGS. 2A and 2B are sectional views showing a first embodiment of a semiconductor device according to the present invention.
Figure 2B:
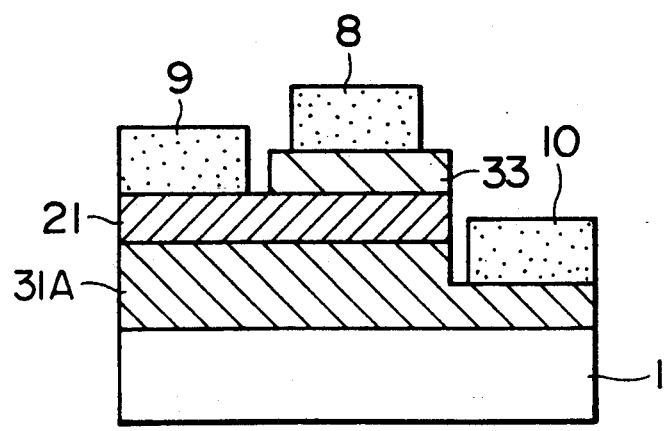

FIGS. 2A and 2B are sectional views showing the first embodiment of a semiconductor device according to the present invention, and show a buried germanium channel MODFET and a bipolar transistor, respectively.

In FIG. 2A, reference numeral 1 designates a silicon substrate which is a body, 2 a channel layer made of germanium, 31 and 32 SiGe alloyed crystal layers formed on both sides of the channel layer 2 and lower one is serving as strain control means (that is, strain control buffer layers), 4 a gate electrode, and 5 and 6 source and drain electrodes. Preferably, at least a portion of the strain control layers 31 and 32 formed on both sides of the channel layer 2 are doped with a p-type impurity, to form a modulation-doped double heterostructure.

Preferably, the p-type impurity concentration is put in a range from $5 \times 10^{17}$ to $5 \times 10^{18}$ cm$^{-3}$. Further, the germanium channel layer 2 has a thickness of 200 Å or less, and the SiGe alloyed crystal layer has a thickness of 200 Å or less.

In the above MODFET, the composition of the layer 31 may be different from that of the layer 32, that is, the double heterostructure may be expressed by $Si_{1-x}Ge_x/Ge/Si_{1-x'}Ge_{x'}$. Further, the double heterostructure including the layers 31, 2 and 33 may be replaced by a superlattice structure which is expressed by $Si_{1-x}Ge_x/Ge/Si_{1-x}Ge_x/Ge/$ --- or Si/Ge/Si/Ge/ ---.

FIG. 2B shows a bipolar transistor, in which the strain control $Si_{1-x}Ge_x$ layer 31A acts as a collector, the p type germanium layer 21 acts as a base, and an $Si_{1-x}Ge_x$ layer 33 acts as an emitter, and are successively formed on the silicon substrate 1 which is a body. Further, a collector electrode 10, a base electrode 9 and an emitter electrode 8 are formed on the layers 31, 21 and 33, respectively. It is to be noted that a compressive strain is imposed on the germanium base layer 21.

Figure 3A:
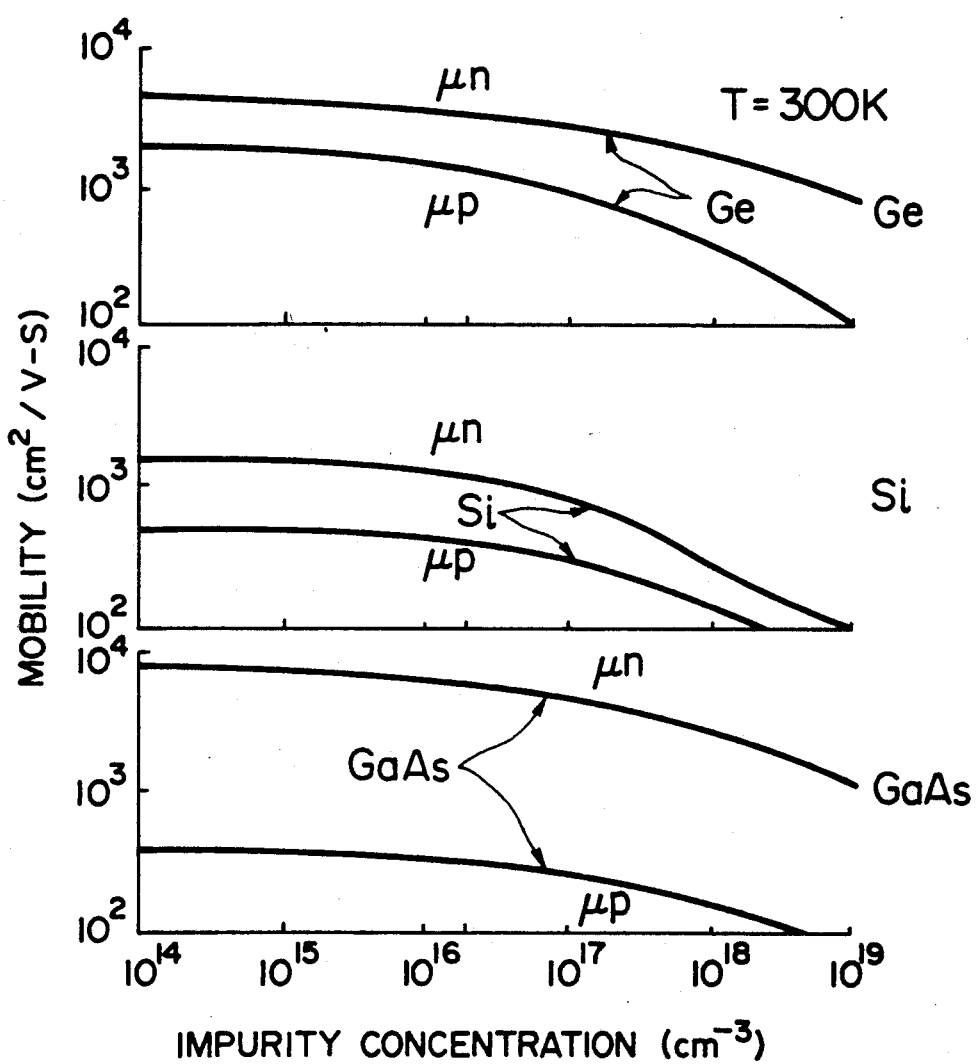
FIG. 3A is a graph showing relations in a germanium single crystal, a silicon single crystal and a GaAs single crystal between impurity concentration and each of electron and hole mobilities.
Figure 3B:
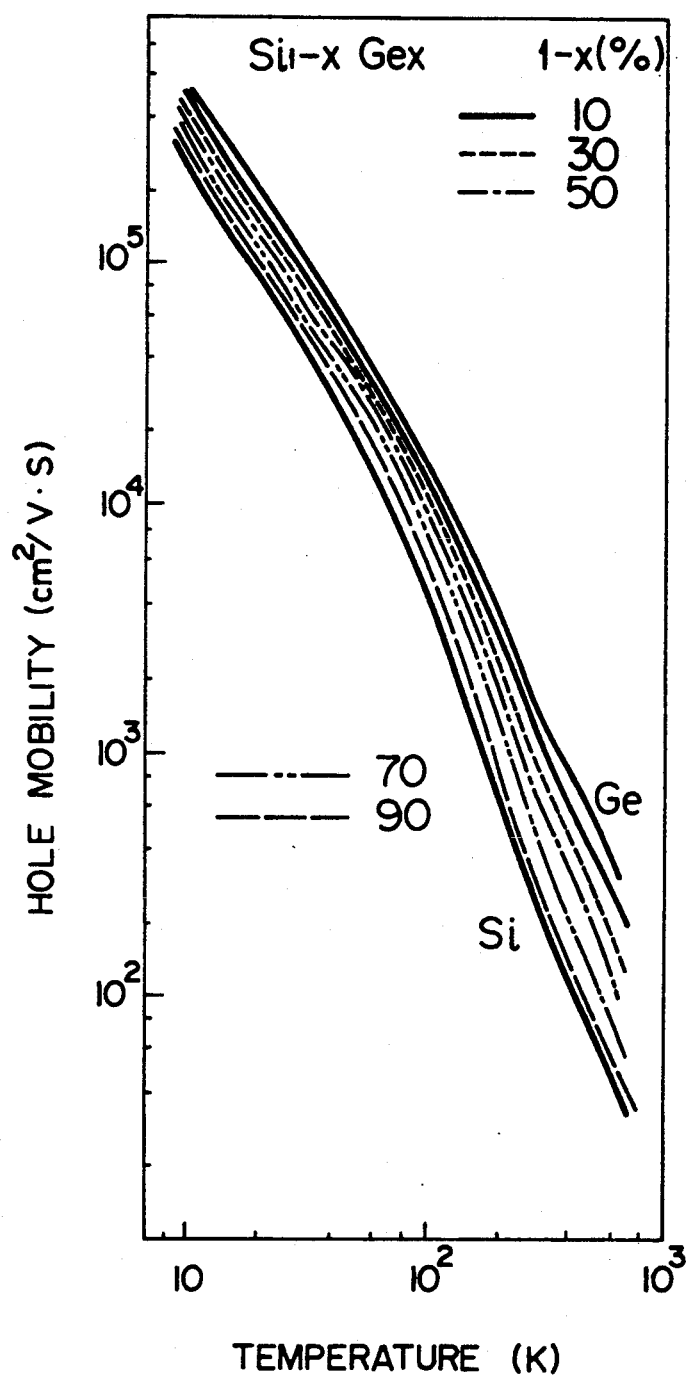
FIG. 3B is a graph showing relations in silicon, $Si_{1-x}Ge_x$ and germanium between temperature and hole mobility.

Germanium has different in electric conduction characteristics from silicon and GaAs. FIG. 3A shows relations in silicon, germanium and GaAs between impurity concentration for each of electron and hole mobilities, and FIG. 3B shows relations in silicon, $Si_{1-x}Ge_x$ and germanium between temperature and hole mobility.

As can be seen from FIG. 3A, germanium has a first feature that hole mobility $\mu_p$ in a low doping range is as high as 1,900 cm$^2$/V.sec, and a second feature that even when the impurity concentration is increased from $10^{15}$ to $10^{19}$ cm$^{-3}$, the electron mobility $\mu_n$ is reduced only a little, that is, the mobility $\mu_n$ is reduced to about one-fourth of its original value.

The first feature of germanium, i.e. high hole mobility in low doping, an provides effective MODFET structure.

Figure 4:
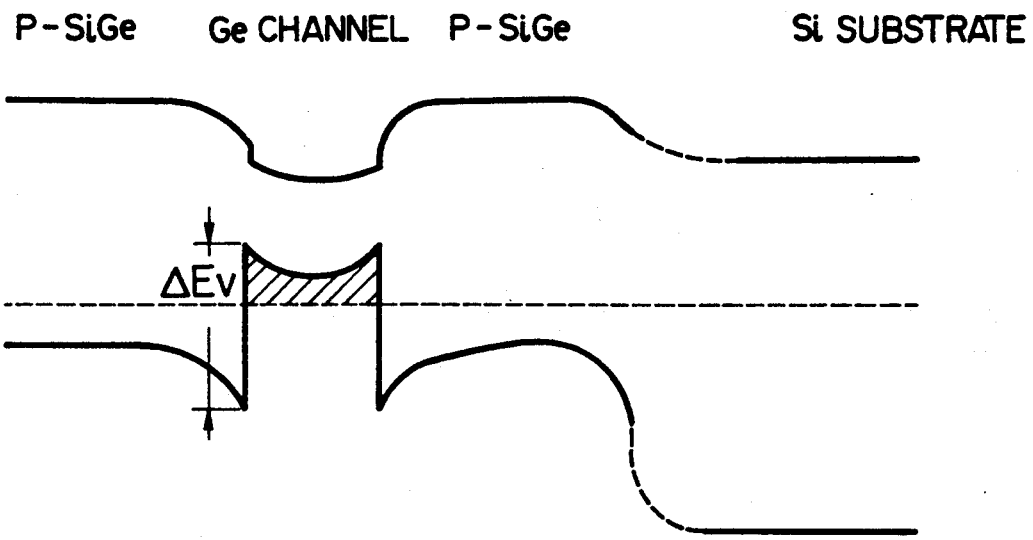
FIG. 4 is a band diagram of the double heterostructure of FIGS. 2A and 2B.

FIG. 4 is a band diagram of the double heterostructure shown in FIGS. 2A and 2B. Referring to FIG. 4, positive holes are supplied from p-SiGe layers to the germanium channel layer which is sandwiched between the p-SiGe layers and forms a potential well, and travel in the germanium channel layer having a large hole mobility $\mu_p$. Owing to a difference in lattice constant between Ge and GeSi, a compressive stress is applied to the germanium layer. This compressive stress is advantageous in two points. First, the germanium layer is strained, and thus the valence-band discontinuity $\Delta E_V$ at the Ge/SiGe interface (that is, the depth of the potential well) is increased. For instance, let us consider a case where an $Si_{0.5}Ge_{0.5}$ layer is used as the SiGe layer. When the germanium layer is formed so as not to be strained, the discontinuity $\Delta E_V$ is nearly equal to 0.16 eV. When the germanium layer is strained, the discontinuity $\Delta E_V$ is nearly equal to 0.26 eV, and thus a sufficiently large number of positive holes can be confined in the potential well (that is, germanium channel layer). Secondarily, the compressive stress, in some cases, can reduce the effective mass of positive hole by a factor of about ten, that is, can increase the hole mobility $\mu_p$ by a factor of about ten. Thus, a high-performance, p-MODFET can be obtained by utilizing compressive stress.

The above effects of compressive stress are well known. It is important that in a semiconductor device according to present invention, the compressive stress is actually applied to a germanium layer to obtain these effects.

The second feature of germanium is effectively utilized in a doped channel FET. That is, even when a germanium channel layer is highly doped with an n-type impurity, electron mobility $\mu_n$ is not reduced too much. That is, the electron mobility $\mu_n$ in a high impurity concentration range is about ten times as large as that in silicon. The drawback of a doped-channel FET made of silicon can be overcome by using a germanium channel layer.

Embodiment-2

Figure 5:
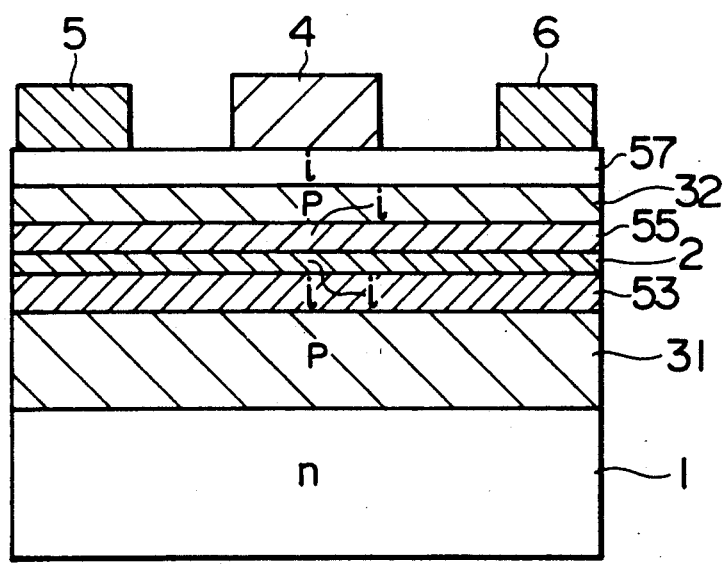
FIG. 5 is a sectional view showing a second embodiment of a semiconductor device according to the present invention.

FIG. 5 shows the second embodiment of a semiconductor device according to the present invention. Referring to FIG. 5, an intrinsic germanium channel layer 2 having a thickness of 100 Å is interposed between the p-$Si_{0.5}Ga_{0.5}$ strain control layer 31 and the p-$Si_{0.5}Ge_{0.5}$ layer 32. Further, intrinsic $Si_{0.5}Ge_{0.5}$ spacer layer 53 is sandwiched between the p-$Si_{0.5}Ge_{0.5}$ layer 31 and the intrinsic germanium channel layer 2, and another intrinsic $Si_{0.5}Ge_{0.5}$ spacer layer 55 is sandwiched between the intrinsic germanium channel layer 2 and the p-$Si_{0.5}Ge_{0.5}$ layer 32. The gate electrode 4 is made of titanium. 5 In more detail, the p-$Si_{0.5}Ge_{0.5}$ strain control layer 31 is epitaxially grown on the silicon substrate 1 to a thickness greater than 5,000 Å. Then, the intrinsic $Si_{0.5}Ge_{0.5}$ layer 53 100 Å thick, the intrinsic germanium channel layer 2 100 Å thick, the intrinsic $Si_{0.5}Ge_{0.5}$ layer 55 100 Å thick, the p-$Si_{0.5}Ge_{0.5}$ layer 32 100 Å thick, and an intrinsic i-$Si_{1-x}Ge_x$ layer 57 100 Å thick (where x lies in a range from 0.5 to 0) are successively piled on the strain control layer 31 by epitaxial growth, to form an MODFET. The epitaxial growth is carried out by using evaporation in ultra-high vacuum (that is, molecular beam epitaxy), and the growth temperature is lower than 550° C. Further, the p-type doping is accomplished by Ga atoms from a Knudsen cell, and the Ga concentration in the doped layers is made equal to $10^{18}$ cm$^{-3}$.

In the channel region of the above MODFET, Hall mobility is about 3,000 cm$^2$/V.sec at 300° K., and about 20,000 cm$^2$/V.sec at 77° K. Further, the sheet carrier concentration is about $1 \times 10^{12}$ cm$^{-2}$, and the effective mass of a hole is 0.06 $m_o$ (where $m_o$ is the mass of electron). As a result, the transconductance $g_m$ of the MODFET can be made equal to 200 mS/mm. Incidentally, reference numerals 5 and 6 in FIG. 5 designate source and drain electrodes.

Although a Schottky gate electrode is used in the MODFET of FIG. 5, an MOS structure may be used in place of the Schottky gate electrode. Further, a channel region including the layers 53, 2, 55 and 32 may be replaced by a superlattice structure where the intrinsic germanium layer and the intrinsic i-$Si_{0.5}Ge_{0.5}$ layer are alternately and repeatedly piled, to increase transconductance $g_m$.

Although a silicon substrate is used in the present embodiment, a germanium substrate can be used in place of the silicon substrate. Further, various layers of the present embodiment may be formed by the chemical vapor deposition (CVD) method which is excellent for mass production.

Embodiment-3

Next, explanation will be made of the third embodiment of a semiconductor device according to the present invention, in which embodiment a p-MODFET having a buried germanium channel and an n-MODFET having a germanium channel are formed on the same substrate.

Figure 6:
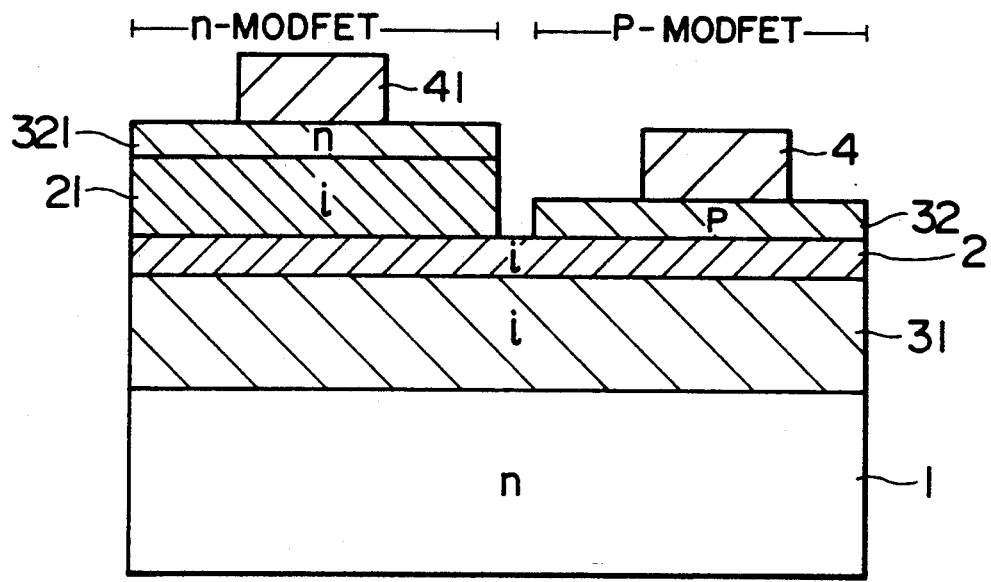
FIG. 6 is a sectional view showing a third embodiment of a semiconductor device according to the present invention.

As shown in FIG. 6, the intrinsic $Si_{0.5}Ge_{0.5}$ buffer layer 31 is grown on the n-silicon substrate 1 to a thickness of 5,000 Å. Then, the i-germanium channel layer 2 having a thickness of 200 Å is formed on the buffer layer 31. Next, that surface area of the germanium layer 2 where the p-MODFET is to be formed, is covered with an $SiO_2$ film. Then, another intrinsic germanium channel layer 21 and an n-$Si_{0.15}Ge_{0.85}$ layer 321 are successively grown. The intrinsic germanium layer 21 and intrinsic $Si_{0.15}Ge_{0.85}$ layer 321 on the $SiO_2$ film are removed, together with the $SiO_2$ film. Thereafter, a portion corresponding to the n-MODFET is coated with a different $SiO_2$ film, and then the intrinsic $Si_{0.5}Ge_{0.5}$ layer 32 is grown. The $Si_{0.5}Ge_{0.5}$ layer on the $SiO_2$ film is removed, together with the $SiO_2$ film. Thereafter, gate electrodes 4 and 41 are formed.

In the present embodiment, the germanium channel of the p-MODFET is strained by compressive stress, and thus valence-band discontinuity $\Delta E_V$ is large. Accordingly, a sufficiently large number of positive holes can be confined in the channel. While, the germanium channel of the n-MODFET is not strained, and the conduction-band discontinuity $\Delta E_C$ is large. Accordingly, a sufficiently large number of electrons can be confined in the germanium channel.

According to the present embodiment, germanium-channel, p-MODFET's and germanium-channel, n-MODFET's can be formed on the same substrate. Thus, a high-speed complementary logic circuit can be obtained.

Embodiment-4

Figure 7:
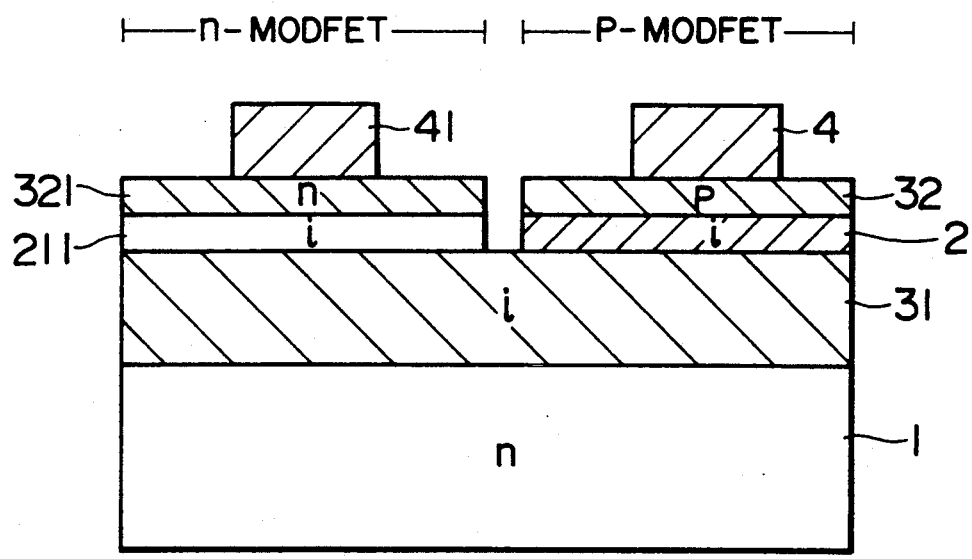
FIG. 7 is a sectional view showing a fourth embodiment of a semiconductor device according to the present invention.

FIG. 7 shows the fourth embodiment of a semiconductor device according to the present invention, in which embodiment an n-MODFET and a p-MODFET are formed on the same substrate. The present embodiment, however, is different from the third embodiment in that the channel layer of the n-MODFET is formed of an i-silicon layer 211 which has been strained. Thus, in the n-MODFET, the conduction-band discontinuity $\Delta E_C$ can be increased to about 0.15 eV. In the present embodiment, the intrinsic $Si_{0.5}Ge_{0.5}$ strain control layer (that is, buffer layer) 31 is formed on the n-silicon substrate 1, and the intrinsic silicon channel layer 211 and the intrinsic germanium channel layer 2 are formed on the buffer layer 31 Further, an n-$Si_{0.5}Ge_{0.5}$ layer 321 is formed on the i-silicon channel layer 211, and the p-$Si_{0.5}Ge_{0.5}$ layer 31 is formed on the intrinsic germanium channel layer 2. The gate electrode 41 of the n-MODFET and the gate electrode 4 of the p-MODFET are formed as shown in FIG. 7. Further, the source and drain electrodes (not shown) of each of the n-MODFET and p-MODFET are formed. Then, an insulating film, a passivation film, and others are formed to complete a complementary MODFET.

Embodiment-5

Next, explanation will be made of the fifth embodiment of a semiconductor device according to the present invention which embodiment is a doped germanium channel MODFET.

Figure 8:
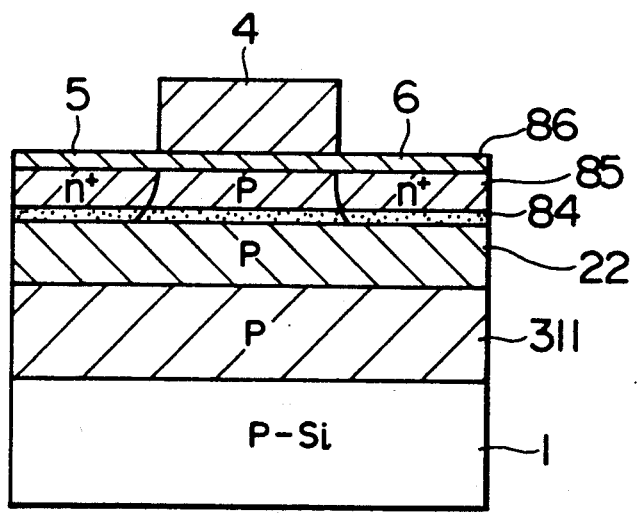
FIG. 8 is a sectional view showing a fifth embodiment of a semiconductor device according to the present invention.

As shown in FIG. 8, a p-$Si_{0.5}Ge_{0.5}$ buffer layer 311 is grown on a p-silicon substrate 1 to a thickness of 5,000 Å, and then a p-germanium layer 22 is grown on the buffer layer 311 to a thickness of 3,000 Å. After the germanium layer 22 has been grown, antimony is evaporated in a molecular beam epitaxy apparatus, to be deposited on the germanium layer 22. Then, Sb atoms are desorbed at 600° C., to leave only one atomic layer 84 of antimony. Next, the temperature of the substrate 1 is reduced to 50° C., and an amorphous germanium layer is grown to a thickness of 500 Å. Then, the substrate temperature is raised to 600° C., to crystallize the amorphous germanium layer by solid epitaxial growth.

Thereafter, an $SiO_2$ gate film 86 is formed by the plasma CVD method, and an aluminum gate electrode 4 is formed on the $SiO_2$ film 86. Then, ion implantation is carried out while using the gate electrode 4 as a mask. That is, arsenic ions are implanted in a p-germanium layer 85 to form source and drain regions 5 and 6.

With a high impurity concentration electron mobility $\mu_n$ in germanium is about ten times as high as that in silicon. Accordingly, the present embodiment (that is, doped germanium channel MOSFET) has a more than five times greater transconductance than a conventional doped-channel FET.

According to the present embodiment, high-speed operation can be performed, since the carrier transport channel is made of germanium. Further, not only electron mobility $\mu_n$ but also hole mobility $\mu_p$ is very large in germanium. Thus, a favorable complementary logic circuit can be formed. Furthermore, in a doped channel layer, the sheet carrier concentration is large, and moreover reduction of electron mobility $\mu_n$ is suppressed. Hence, a high transconductance can be obtained.

Embodiment-6

Figure 9A:
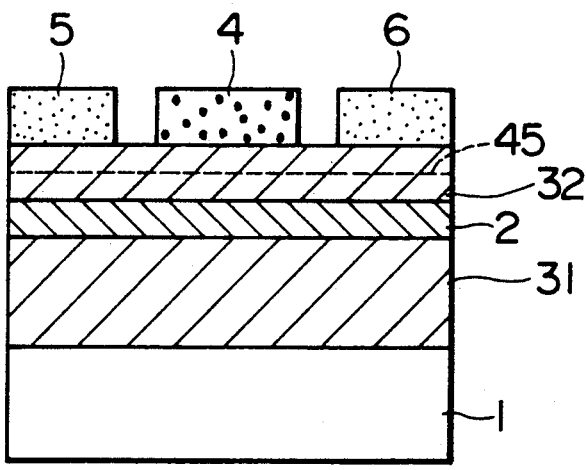
FIGS. 9A, 9B and 10A to 10D are diagrams for explaining a sixth embodiment of a semiconductor device according to the present invention.

FIG. 9A shows the sixth embodiment of a semiconductor device according to the present invention which embodiment is a p-channel, modulation-doped transistor.

Figure 10A:
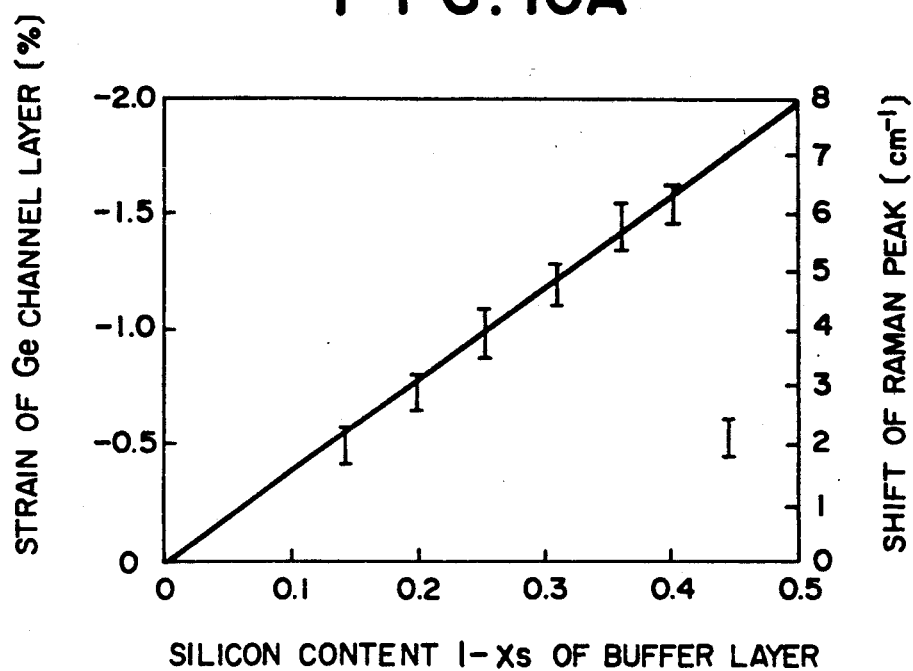

Referring to FIG. 9A, a $Si_{1-x}Ge_x$ buffer layer 31 (where $0.15 < 1-x_s < 0.45$) having a thickness of 500 nm is heteroepitaxially grown on an n-germanium substrate 1 kept at 520° C., by molecular beam epitaxy. Then, the germanium channel layer 2 of 20 nm thickness and the p-$Si_{0.5}Ge_{0.5}$ layer 32 of 30 nm thickness are grown at a substrate temperature of 400° C. The thickness of the buffer layer 31 is greater than the critical thickness of strained growth. Hence, many misfit dislocations are generated at the interface between the substrate 1 and the buffer layer 31, and that portion of the buffer layer 31 which is kept in contact with the substrate 1, becomes equal in lattice constant to the bulk of the buffer layer 31. The buffer layer 31 is formed by non-commensurate growth (that is, relaxed growth) while, the thickness of each germanium layer 2 and $Si_{0.5}Ge_{0.5}$ layer 32 is far smaller than the critical thickness of strained growth. Hence, these layers 2 and 32 are grown so as to be equal in in-plane lattice constant to the buffer layer 31. That is, the layers 2 and 32 are formed by commensurate growth (namely, strained growth). The above facts have been confirmed by the TEM observation of a cross section by Raman scattering spectroscopy. FIG. 10A shows a relation between silicon content $1-x_s$ of the buffer layer and strain of the germanium channel layer determined by Raman scattering spectroscopy. The strain on the germanium channel silicon content $1-x_s$ of the buffer layer as in theory. It is to be noted that in the case where the silicon content $1-x_s$ of the buffer layer is 0.45, the thickness of the germanium layer equal to 20 nm which exceeds the critical thickness of commensurate growth, and thus the germanium layer is formed by non-commensurate growth (that is, relaxed growth).

Figure 10B:
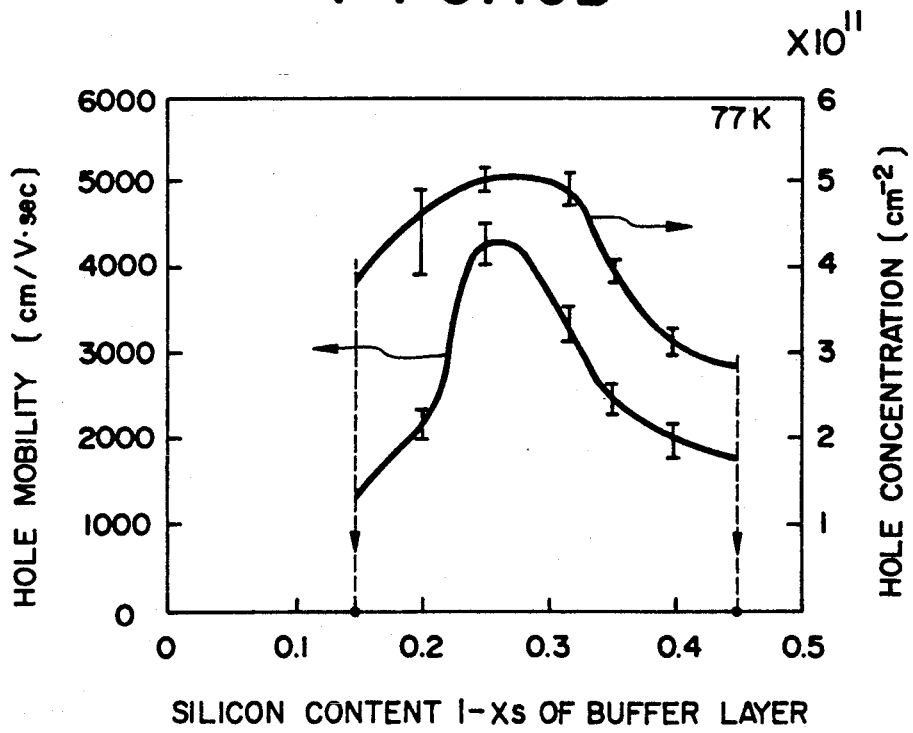
Figure 10C:
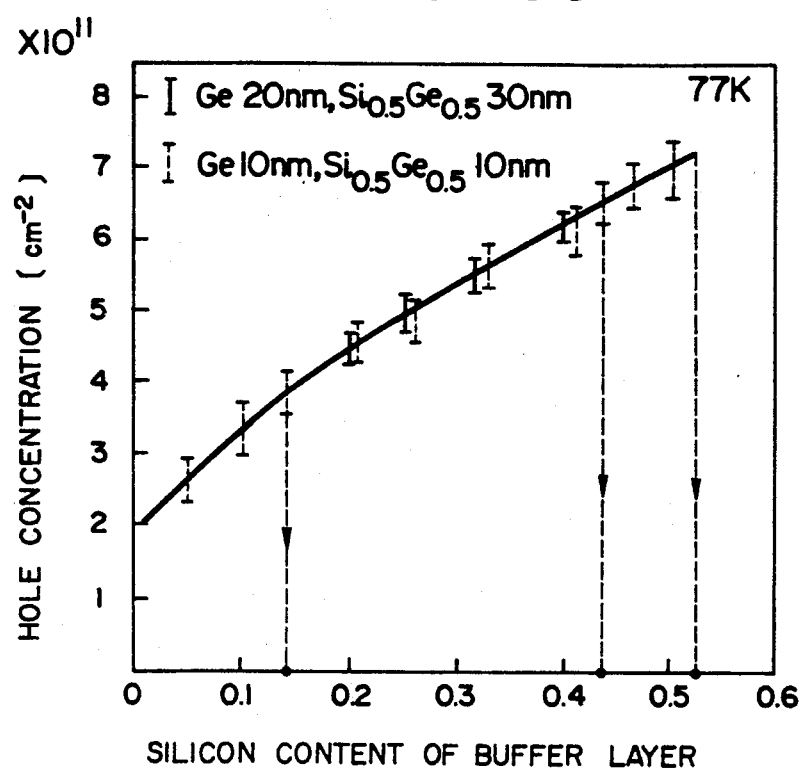
Figure 10D:
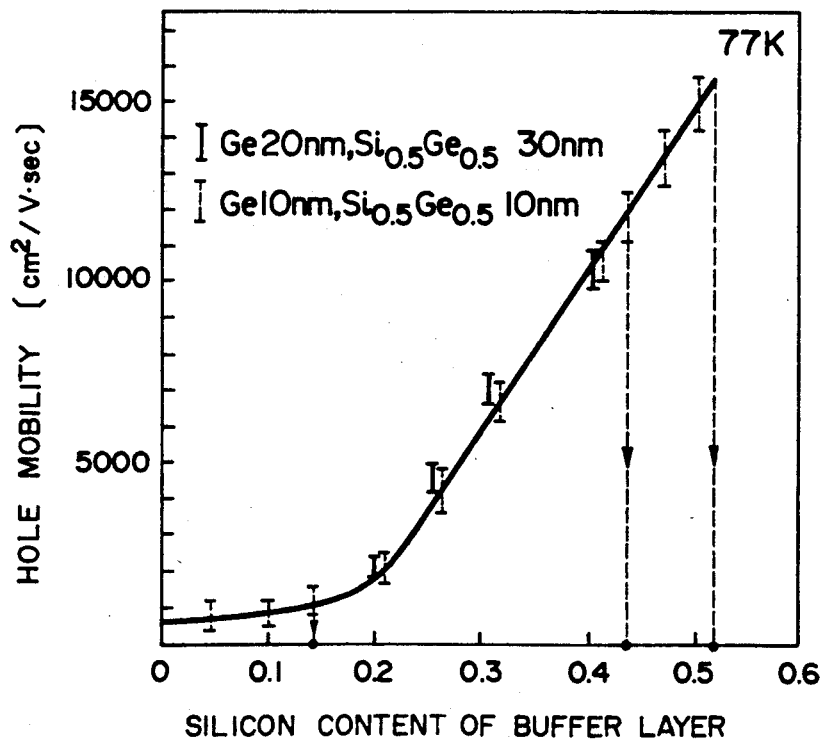

The $Si_{0.5}Ge_{0.5}$ layer 32 is doped with a p-type impurity by so-called δ-doping. That is, an $Si_{0.5}Ge_{0.5}$ film having a thickness of 15 nm is first grown at a substrate temperature of 400° C. Then, the substrate temperature is reduced to 50° C., and Ga atoms are absorbed by the surface of the $Si_{0.5}Ge_{0.5}$ film. Thereafter, an amorphous $Si_{0.5}Ge_{0.5}$ film having a thickness of 15 nm is deposited. Then, the substrate temperature is raised to 450° C., to crystallize the amorphous film by solid phase epitaxy. Thus, Ga atoms 45 are buried in the $Si_{0.5}Ge_{0.5}$ layer 32 in the form of a spike. An AuGa electrode is formed on the above structure to investigate electric conduction properties of the structure. FIG. 10B shows a relation between the silicon content $1-x_s$ of the buffer layer and the hole mobility determined from Hall-effect measurements at 77° K. and a relation between the silicon content $1-x_s$ and the hole concentration determined from Hall-effect measurements at 77° K. In the range where the silicon content $1-x_s$ is less than 0.25, hole mobility and hole concentration increase with increasing silicon content, as expected. In the range where silicon content is greater than 0.25, however, hole mobility and hole concentration decrease with the increasing silicon content. From TEM observation of a cross section, it has been known that threading dislocations are abruptly increased in the range of $1-x_s > 0.25$. That is, it has been suggested that hole mobility and hole concentration are reduced by dislocations. In order to reduce threading dislocations, thickness of the $Si_{1-x_s}Ge_{x_s}$ buffer layer is increased to 2 μm, and a layer having a superlattice structure $Si_{1-x_s}Ge_{x_s}/Ge/Si_{1-x_s}Ge_{x_s}/Ge/$ --- is provided between the germanium substrate 1 and the buffer layer 31. In this case, hole mobility and hole concentration are increased in the range of $1-x_s > 0.25$, as shown in FIGS. 10C and 10D. Even in the above case, when the silicon content $1-x_s$ is made greater than 0.4 or less than 0.15, dislocations are generated in the germanium channel layer 2 or the $Si_{0.5}Ge_{0.5}$ layer 32, and the layer 2 or 32 is formed by non-commensurate growth. Thus, a two-dimensional hole gas is not observed, as indicated by black points in FIGS. 10C and 10D. In other words, in a case where the germanium layer has a thickness of 20 nm and the $Si_{0.5}Ge_{0.5}$ layer has a thickness of 30 nm, it is preferable to put the silicon content of the buffer layer in the range from 0.2 to 0.4 (that is, $0.2 \leq 1-x_s \leq 0.4$). Further, in a case where each of the germanium layer and the $Si_{0.5}Ge_{0.5}$ layer have a thickness of 10 nm, the silicon content of the buffer layer can be put in the range from 0 to 0.5 (that is, $0 < 1-x_s < 0.5$). Although a germanium substrate is used in the present embodiment, a silicon substrate may be used in place of the germanium substrate.

The maximum hole mobility achieved by the present embodiment is 50,000 cm²/V.sec at 77° K. This value is about a hundred times as high as a conventional value.

A gate electrode 4 made of titanium was provided on the above-mentioned structure, to form a 2 μm. The field effect mobility in this transistor was calculated from dependence of transductance $g_m$ on the gate voltage $V_G$, and found to be greater than 10,000 cm²/V.sec.

Figure 9B:
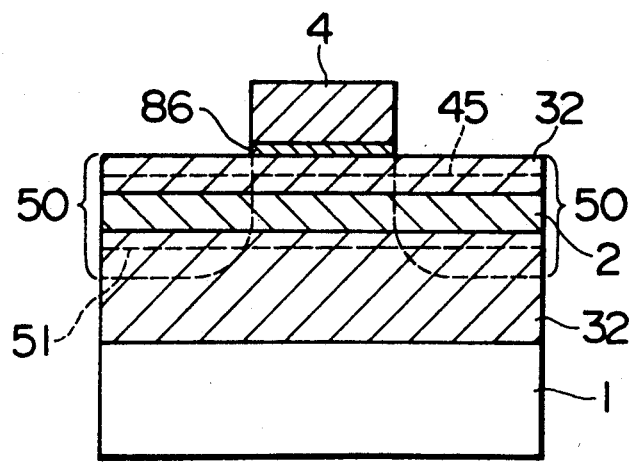

FIG. 9B shows a modified version of the structure of FIG. 9A. Referring to FIG. 9B, a WSi gate 4 is formed on a gate insulating film 86, and P+-regions 50 are formed in a self-aligned structure, to form an MOSFET which has a gate length of less than 1 μm. In order to prevent punch through due to miniaturization, an Sb doping spike 51 is formed as shown in FIG. 9B. In an ordinary n-channel MOSFET using silicon, velocity overshoot, that is, a phenomenon that carrier velocity exceeds saturation velocity, can be observed only when the channel length is less than 0.1 μm. In the MOSFET of FIG. 9B, Hall mobility is high, and thus velocity overshooting is generated even when the channel length is about 0.3 μm. That is, the performance of the MOSFET is improved by the velocity overshooting.

Embodiment-7

Next, explanation will be made of the seventh embodiment of a semiconductor device according to the present invention which embodiment is a p-channel, doped-channel FET.

Figure 11:
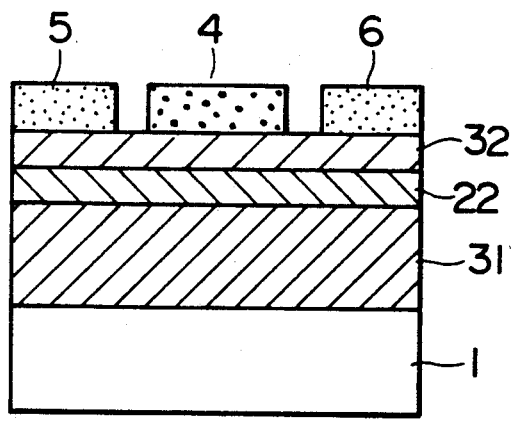
FIG. 11 is a sectional view showing a seventh embodiment of a semiconductor device according to the present invention.

Referring to FIG. 11, a p-type germanium channel layer 22 is formed in such a manner that a germanium layer is grown on the buffer layer 31 by the chemical vapor deposition method using a $GeH_4$ gas, and the germanium layer is doped with boron atoms from a $B_2H_6$ gas at a boron concentration of $1 \times 10^{18}$ cm³. The germanium channel layer 22 is strained, and hence the hole mobility in the channel layer 22 is about twice as large as that in an ordinary germanium layer. Further, the hole concentration in the germanium channel layer 22 is high. Accordingly, the present embodiment is substantially equal in transconductance at room temperature to the modulation-doped transistor of FIG. 9A. In FIG. 11, the same reference numerals as in FIG. 9A designate like parts.

Embodiment-8

Next, explanation will be made of the eighth embodiment of a semiconductor device according to the present invention which embodiment is a bipolar transistor utilizing a two-dimensional hole gas.

Figure 12A:
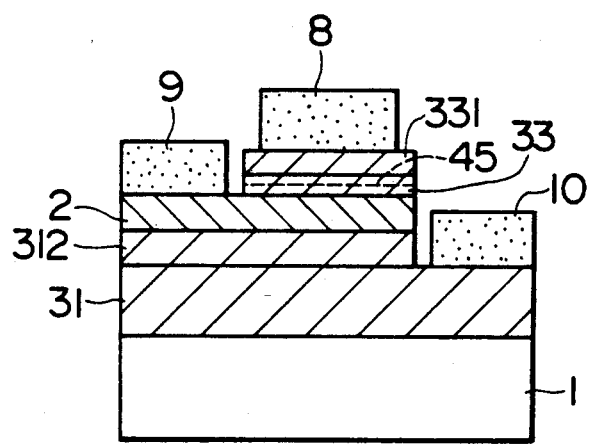
FIGS. 12A and 12B are sectional views showing an eighth embodiment of a semiconductor device according to the present invention.
Figure 12B:
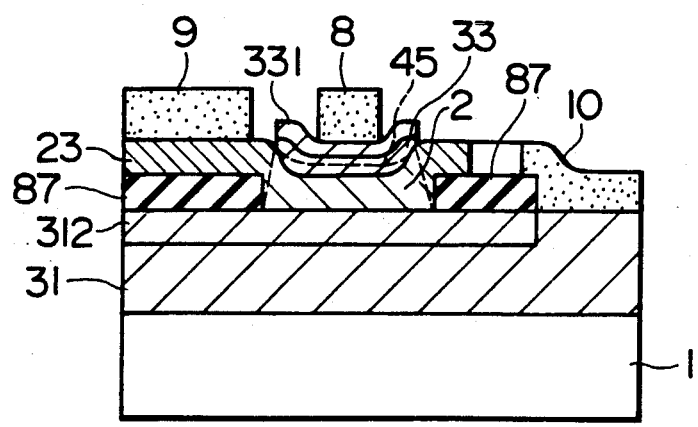

As shown in FIG. 12A, an n+-$Si_{0.25}Ge_{0.75}$ collector layer 31 of 800 nm thickness and an n−-$Si_{0.25}Ge_{0.75}$ collector layer 312 of 200 nm thickness are grown by molecular beam epitaxy, in a state with the p-germanium substrate 1 is kept at 520° C. Then, an undoped germanium base layer 2 of 20 nm thickness, an undoped $Si_{0.4}Ge_{0.6}$ layer 33 having a Ga doping spike 45 and a thickness of 20 nm, and an n+-$Si_{0.4}Ge_{0.6}$ emitter layer 331 of 80 nm thickness are successively formed. In the above structure, a two-dimensional hole gas produced at the interface between the undoped $Si_{0.4}Ge_{0.6}$ layer and the germanium layer serves as a low-resistance, thin base. After it has been confirmed that the structure of FIG. 12A can operate as a bipolar transistor, a transistor shown in FIG. 12B was fabricated. Referring to FIG. 12B, an $SiO_2$ film 87 was formed by the chemical vapor deposition method, and an aperture was provided in the $SiO_2$ film 87 at a position corresponding to the undoped $Si_{0.4}Ge_{0.6}$ layer 33. Then, the base and emitter layers were formed as shown in FIG. 12B. In this structure, an extrinsic base portion was formed of a p+-polycrystalline germanium film 23, and thus the parasitic resistance and capacitance due to the outer base portion were greatly reduced. The transition frequency $f_T$ of the above transistor was 150 GHz. In FIG. 12a and 12B, the same reference numerals designate like parts.

Embodiment-9

Next, explanation will be made of the ninth embodiment of a semiconductor device according to the present invention, which embodiment is a heterostructure, bipolar transistor having an ordinary p-base layer.

Figure 13:
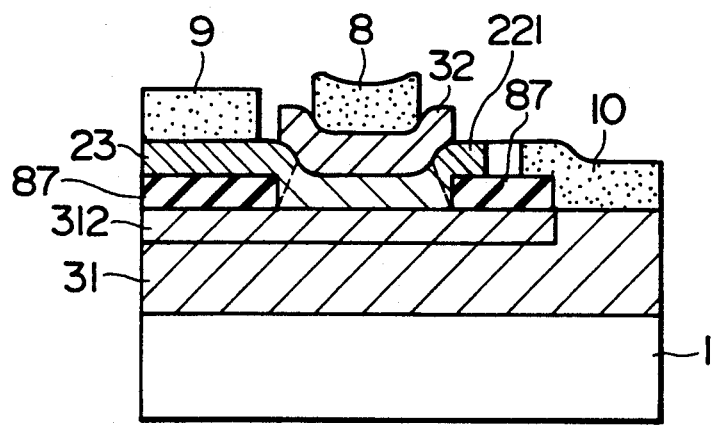
FIG. 13 is a sectional view showing a ninth embodiment of a semiconductor device according to the present invention.

As shown in FIG. 13, a p-germanium base layer 221 is formed in the same manner as in the EMBODIMENT-7. The boron concentration of the base layer 221 is $1 \times 10^{19}$ cm$^{-3}$. The hole mobility in germanium is large even in a high impurity concentration range due to strain effect. Accordingly, the transition frequency $f_T$ of the present embodiment is as high as 150 GHz. In FIG. 13, the same reference numerals as in FIGS. 12A and 12B designate equivalent or identical parts.

Embodiment-10

Next, explanation will be made of the tenth embodiment of a semiconductor device according to the present invention. In this embodiment a p-channel field effect transistor and a bipolar transistor each utilizing a two-dimensional hole gas are formed on the same substrate so as to form an integrated circuit.

Figure 14:
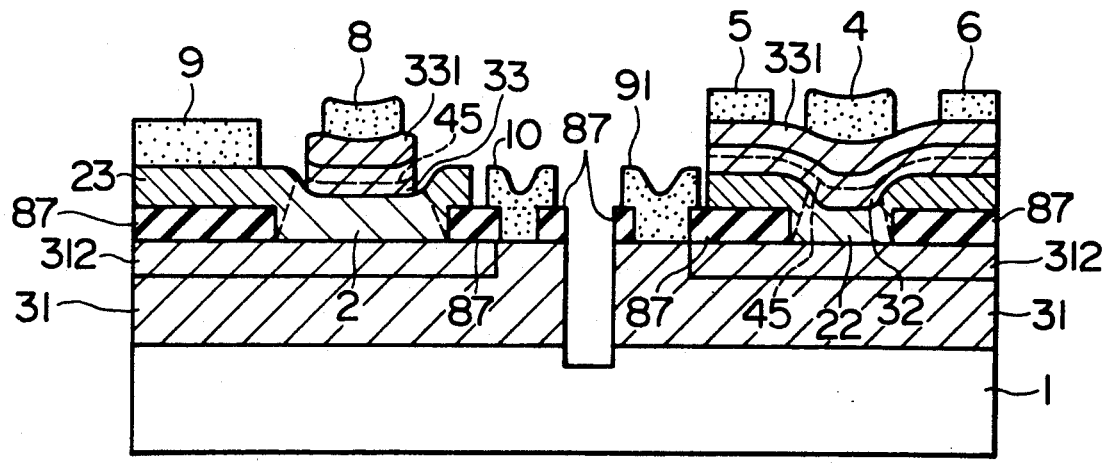
FIG. 14 is a sectional view showing a tenth embodiment of a semiconductor device according to the present invention.

As shown in FIG. 14, the field effect transistor and the bipolar transistor have the same structure, in the direction of thickness. Accordingly, the present embodiment can be formed in the same manner as in the fabrication method of the bipolar transistor described in EMBODIMENT-8. According to the present embodiment, a monolithic integrated circuit is formed of bipolar transistors which have high current driving capacity, and field effect transistors which are suited to form an integrated circuit. Thus, an ultra-high-speed logic circuit can be obtained. In FIG. 14, reference numeral 91 designates an electrode for applying a bias voltage to the substrate, 31 an n+-$Si_{0.25}Ge_{0.75}$ buffer layer, 312 an n−-$Si_{0.25}Ge_{0.75}$ buffer layer, and 331 an n+-$Si_{0.4}Ge_{0.6}$ layer.

Embodiment-11

Next, explanation will be made of the eleventh embodiment of a semiconductor device according to the present invention. In this embodiment p-channel and n-channel modulation-doped transistors are formed on the same substrate so as to form an integrated circuit.

Figure 15:
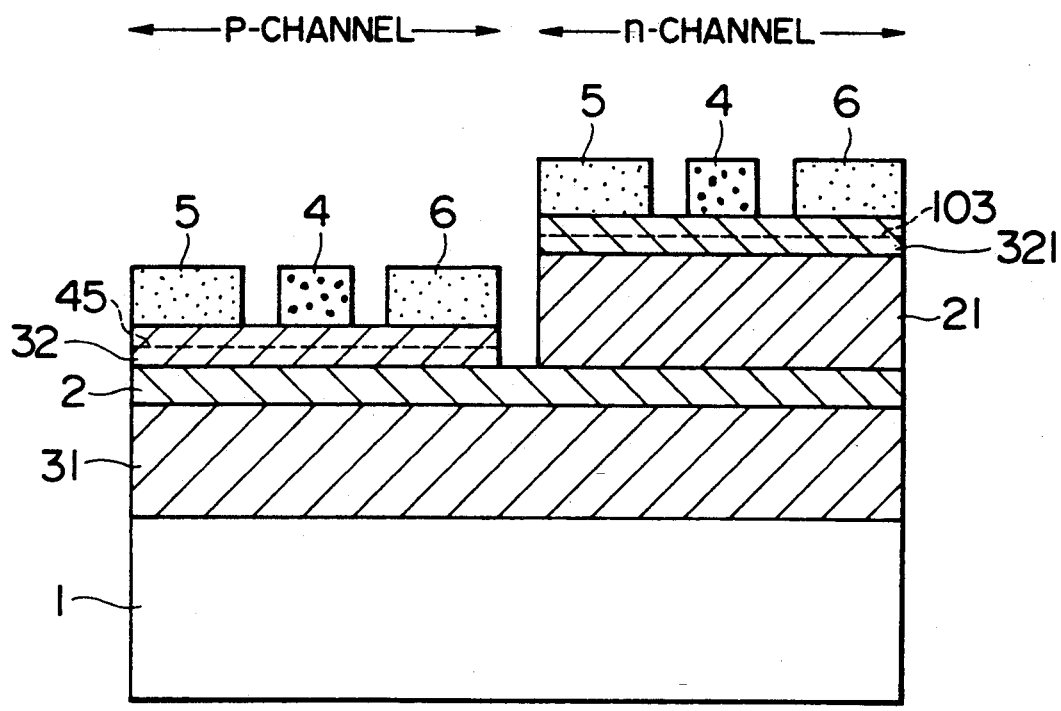
FIG. 15 is a sectional view showing a eleventh embodiment of a semiconductor device according to the present invention.

As shown in FIG. 15, the p-channel transistor is equal in structure to the transistor of FIG. 9A, and the n-channel transistor uses a germanium layer 21 which is formed by non-commensurate growth (that is, relaxed growth), as the channel layer. This is because when the germanium layer 21 is not strained, a large conduction-band discontinuity $\Delta E_C$ is obtained at the $Si_{0.15}Ge_{0.85}$/Ge interface. According to the present embodiment, a complementary logic circuit can be obtained which operates at high speed and has low power dissipation. In FIG. 15, reference numeral 321 designates an $Si_{0.15}Ge_{0.85}$ layer, and 103 an Sb doping spike.

According to the above embodiment, a two-dimensional hole gas is generated in a germanium layer having a compressive strain, and high-speed operation of a field effect transistor or bipolar transistor is achieved by utilizing two-dimensional hole gas.

Embodiment-12

In the above embodiments, a compressive strain is imposed on a germanium layer which is a carrier transport layer, by a strain control layer. However, when the difference in lattice constant between the germanium layer and the strain control layer is greater than a predetermined value, misfit dislocations are generated, and thus carrier mobility is abruptly decreased, as has been explained with reference to FIGS. 10B, 10C and 10D. A structure for suppressing the generation of misfit dislocations is used in the twelfth embodiment of a semiconductor device according to the present invention, which embodiment is a field effect transistor.

In the present embodiment, an insulating layer 87 is formed just under a source 5 and a drain 6. In more detail, a main surface of a monocrystalline substrate 1 is coated by the insulating layer 87, and an aperture is provided in the insulating layer 87 at a channel portion 2. Then, a semiconductor layer is formed all over the surface through heteroepitaxial growth techniques.

As will be explained later, the above structure is especially effective for a case where the substrate is made of a material having a band gap Eg less than 1 eV such as germanium.

Next, explanation will be made of the operation of the above structure in a case where a heterostructure SiGe/Si is used, by way of example.

Figure 16:
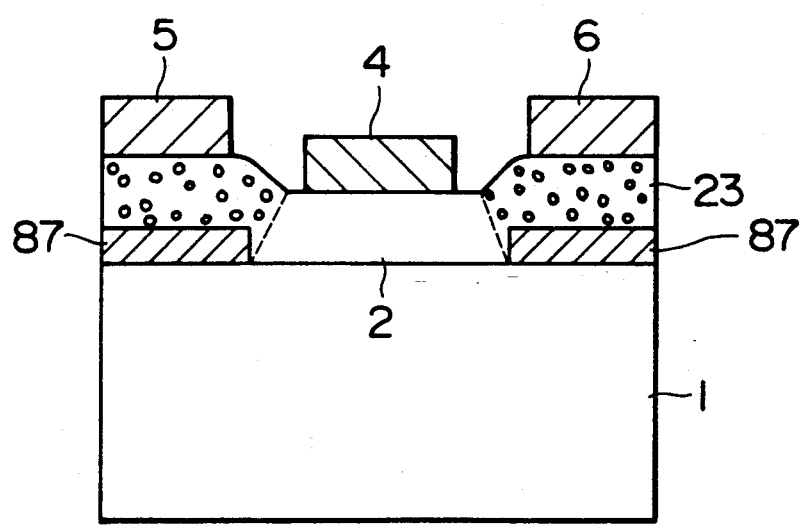
FIGS. 16 to 21 are diagrams for explaining a twelfth embodiment of a semiconductor device according to the present invention.
Figure 17A:
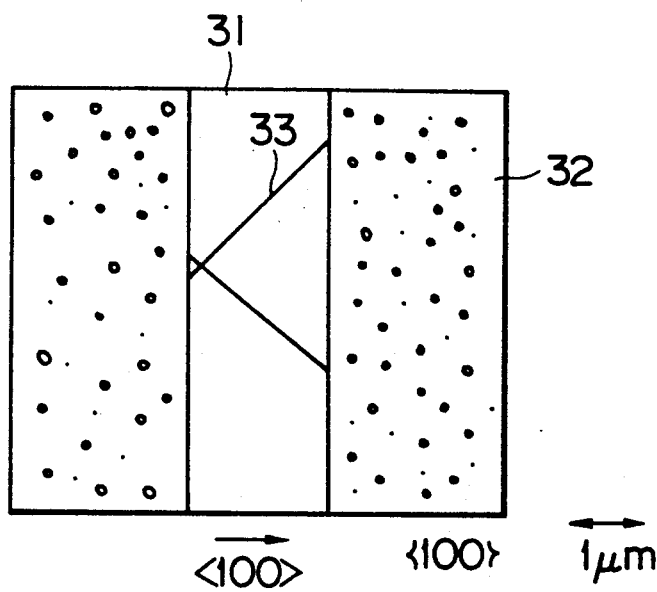
Figure 17B:
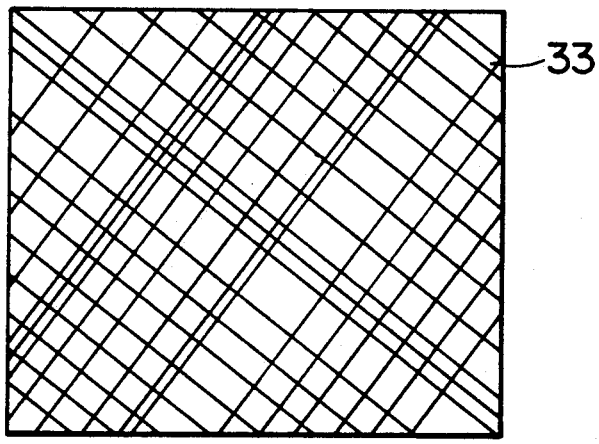

FIG. 17A is a TEM image of a sample which is formed in such a manner that a stripe-shaped aperture is provided in an $SiO_2$ film, and an $Si_{0.5}Ge_{0.5}$ film of 200 Å thickness is grown on the whole surface. FIG. 17B shows a case where the $Si_{0.5}Ge_{0.5}$ film is epitaxially grown on a silicon substrate without interposing the SiO$_2$ film between the Si$_{0.5}$Ge$_{0.5}$ film and the silicon substrate. As is apparent from FIGS. 17A and 17B, when only the stripe-shaped portion of the Si$_{0.5}$Ge$_{0.5}$ film is crystallized without being affected by the SiO$_2$ film, misfit dislocations are decreased the a great degree. This is because the strain due to lattice mismatch is relieved at the boundary between the stripe-shaped Si$_{0.5}$Ge$_{0.5}$ single crystal and the Si$_{0.5}$Ge$_{0.5}$ poly-crystal formed on the SiO$_2$ film, which poly-crystal is indicated by reference numeral 23 in FIG. 16.

Further, the structure of the insulating film is formed beneath the source and drain portions as is a SOI (semiconductor on insulator) structure. Accordingly, this structure can reduce parasitic capacitance of pn junctions of the source and the drain, and thus makes possible the high-speed operation of the device.

In a case where the substrate is made of a material having a small band gap such as germanium, a considerable amount of reverse leakage current flows through the pn junction between the substrate and a channel layer at room temperature, and thus carriers travel in the substrate. Accordingly, it is difficult to operate the device at room temperature. According to the present embodiment, the area of the pn junction is limited, as shown in FIG. 16. Thus, the leakage current is reduced, and the device can operate at room temperature.

Figure 18:
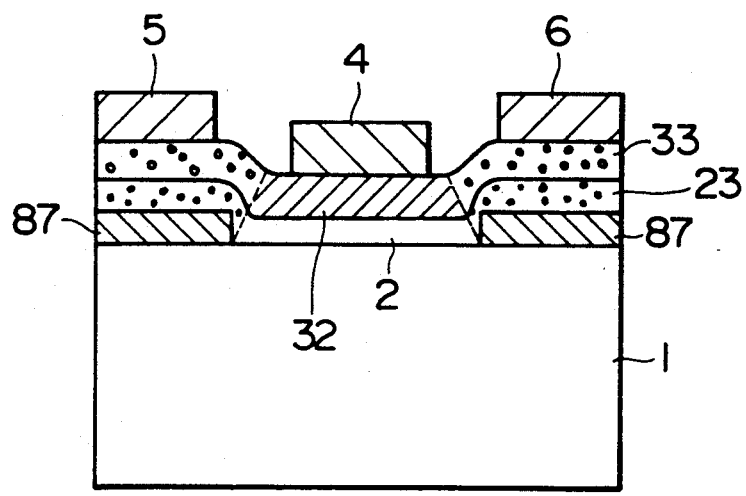

Further, explanation will be made of a p-MODFET including an Si$_{0.6}$Ge$_{0.4}$ channel layer. Referring to FIG. 18, an SiO$_2$ film 87 is formed on a silicon substrate 1 by the LOCOS (localized oxidation of silicon) method. Then, an Si$_{0.6}$Ge$_{0.4}$ film 2 of 200 Å thickness and a p-silicon film 32 of 300 Å thickness are successively grown at a
substrate temperature of 400° C by molecular beam epitaxy. At this time, polycrystalline regions 23 and 33 are formed on the SiO$_2$ film. Next, a titanium gate electrode 4, an AuGa source electrode 5 and an AuGa drain electrode 6 are formed by vacuum evaporation. The alloying for putting the AuGa electrodes in ohmic contact with the region 33 is done at 330° C. Hall-effect measurements were made for this p-MODFET, and it was found that the sheet carrier concentration N$_S$ at 77° K. was equal to $1 \times 10^{12}$ cm$^{-2}$ and the Hall mobility $\mu$ at 77° K. was equal to 5,000 cm$^2$/V.sec. These values were far superior to the conventional ones. This is because the x of the Si$_{1-x}$Ge$_x$ channel layer is made as high as 0.4 and hence the valence-band discontinuity $\Delta E_V$ is as large as 0.3 eV, and also because a compressive strain of about 1.6% reduces the effective mass of positive holes. Thus, the transconductance of the MODFET was 50 mS/mm.

Figure 19:
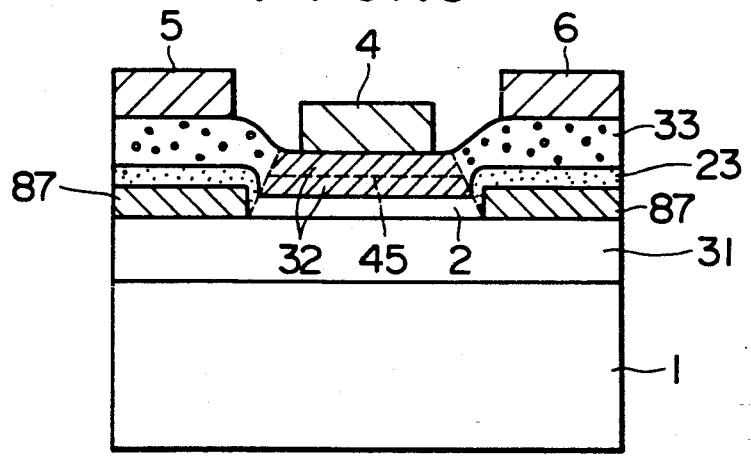

Next, explanation will be made of a p-MODFET including a germanium channel layer. Referring to FIG. 19, an Si$_{0.5}$Ge$_{0.5}$ buffer layer 31 of 2,000 Å thickness is epitaxially grown on a germanium or silicon substrate 1 at a substrate temperature of 520° C. Next, an SiO$_2$ film 87 is formed by the plasma CVD method, and is then patterned. Thereafter, a germanium channel layer 2 of 200 Å thickness and an Si$_{0.5}$Ge$_{0.5}$ film 32 of 150 Å thick are grown at a substrate temperature of 400° C. Then, the substrate temperature is reduced to room temperature. Next, Ga atoms are absorbed by the surface of the Si$_{0.5}$Ge$_{0.5}$ film 32, and an amorphous Si$_{0.5}$Ge$_{0.5}$ film of 150 Å thickness is deposited. Then, the substrate is kept at 450° C. for one hour, to crystallize the amorphous Si$_{0.5}$Ge$_{0.5}$ film by solid epitaxial growth. Thus, a Ga doping spike 45 is buried in an Si$_{0.5}$Ge$_{0.5}$ layer.

In this MODFET, holes travel in the undoped germanium layer which has been subjected to a compressive strain. In the undoped germanium layer, the hole mobility is large, and moreover alloy scattering does not occur. Further, the effective mass of hole is reduced by the compressive strain. Thus, the hole mobility is 10,000 cm$^2$/V.sec at room temperature, and is 50,000 cm$^2$/V.sec at 77° K. The transconductance g$_m$ of the MODFET is 100 mS/mm at room temperature, and is 200 mS/mm at 77° K.

Figure 20:
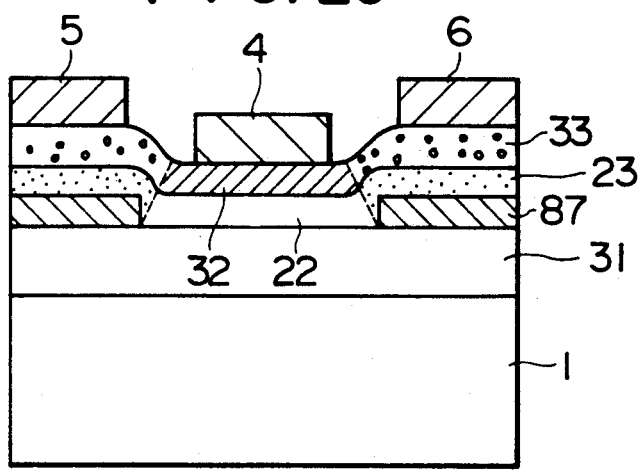

FIG. 20 shows a p-channel, doped-channel FET including a boron-doped germanium channel layer 22.

Like the MODFET of FIG. 19, the FET of FIG. 20 includes a strained germanium layer. However, the FET of FIG. 20 is different from the MODFET of FIG. 19 in that the germanium layer 22 is 200 Å thick and is doped with boron at an impurity concentration of about $10^{18}$ cm$^{-3}$. The doped-channel FET of FIG. 20 is fabricated in substantially the same manner as the MODFET of FIG. 19, and the boron doping is carried out by the evaporation method using a germanium source which contains boron. This doped-channel FET is advantageous in that the sheet carrier concentration can be made as high as $2 \times 10^{12}$ cm$^2$.

Figure 21:
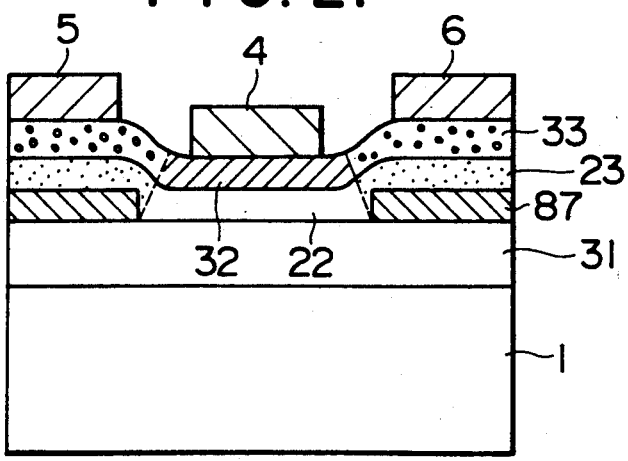

Next, explanation will be made of an N-channel, doped-channel FET including an antimony-doped germanium layer 22, which FET is shown in FIG. 21.

The doped-channel FET of FIG. 21 is different from the doped-channel FET of FIG. 20 in that the dopant is antimony, and a gate electrode 4 is made of platinum or gold. Even when a germanium layer is doped with an n-type impurity at an impurity concentration of $10^{18}$ cm$^{-3}$, the electron mobility in the germanium layer is as high as about 1,000 cm$^2$/V.sec, and thus an FET including such a germanium channel layer has a high transconductance at room temperature. The transconductance of the doped channel FET of FIG. 21 is 100 mS/mm at room temperature.

The present embodiment is not limited to a silicon-germanium system, but is applicable to other hetero systems such as a GaInAs-GaAs system and a GaInAsAlInAs system.

According to the present embodiment, a semiconductor film having large lattice mismatch can be epitaxially grown without generating misfit dislocations, and hence strain effect can be effectively utilized. Moreover, parasitic capacitance and leakage current are reduced. Thus, a heterostructure FET can be realized which performs a high-speed operation at high and low temperatures.

As has been explained in the foregoing, according to the present invention, an ultra-high-speed transistor can be obtained. Further, high-speed MODFET's and bipolar transistors can be readily formed on the same substrate to make an integrated circuit. That is, an integrated circuit can be obtained which has high operation speed. Furthermore, in a case where a complementary circuit is formed of p-type MODFET's and n-type MODFET's, the carrier mobility is high in each of the p-type MODFET and the n-type MODFET, and thus the complementary circuit can perform a high-speed operation.

In addition, when a large compressive strain is imposed on a channel layer as shown in FIG. 16, the carrier mobility in the channel layer can be increased to a limit value.

It is further understood by those skilled in the art that the foregoing description shows only preferred embodiments of the disclosed device and that various changes and modifications may be made in the invention without departing from the spirit and scope thereof.

We claim:

1. A semiconductor device comprising:
   a substrate;
   a first layer, having a crystalline structure;
   a charge carrier transport region, constituted by a crystalline germanium layer formed on said first layer; and
   a third layer formed on said germanium layer, wherein said first layer has a sufficiently large thickness, of at least 5000 Å, such that the first layer imposes a compressive strain on the germanium layer, so as to increase a valence-band discontinuity between said crystalline germanium layer and said third layer as compared to a valence-band discontinuity between a layer of crystalline germanium and a layer of material of the third layer in a case that no compressive strain is applied to the layer of crystalline germanium.

2. A semiconductor device according to claim 1, wherein said first layer is formed of a silicon-germanium alloyed crystal, and said compressive strain of said germanium layer can be changed by varying the alloy ratio of said silicon-germanium alloyed crystal, so as to provide strain control.

3. A semiconductor device according to claim 2, wherein at least a portion of said silicon-germanium alloyed crystal is doped with a p-type impurity.

4. A semiconductor device according to claim 2, wherein said silicon-germanium alloyed crystal layer has a thickness of no more than 200 Å.

5. A semiconductor device according to claim 2, wherein said crystalline germanium layer and said silicon-germanium alloyed crystal layer are alternately and repeatedly piled.

6. A semiconductor device according to claim 1, wherein at least one layer of said first layer, said crystalline germanium layer, and said third layer is doped with p-type impurities.

7. A semiconductor device according to claim 1, wherein said strain applied to said germanium layer is 0.5 to 1.5%.

8. A semiconductor device according to claim 1, wherein said third layer is formed of a silicon-germanium alloyed crystal.

9. A semiconductor device according to claim 1, wherein said third layer means is from 10 nm to 30 nm thick.

10. A semiconductor device according to claim 1, wherein said crystalline germanium layer is from 10 nm to 20 nm thick.

11. A semiconductor device according to claim 1, wherein said semiconductor device is a hetero-structure field effect transistor having a gate electrode, and a source electrode and a drain electrode spaced from each other with said gate electrode between said source electrode and said drain electrode, and said source electrode, said gate electrode and said drain electrode being formed on said third layer.

12. A semiconductor device according to claim 1, wherein said semiconductor device is a hetero-structure bipolar transistor having an emitter electrode formed on said third layer, a base electrode formed on said crystalline germanium layer, and a collector electrode formed on said first layer.

13. A semiconductor device, comprising:
    a substrate;
    a first layer, made of a $Si_{1-x_s}Ge_{x_s}$ alloyed crystal (where $0<x_x<1$), formed on said substrate;
    a second layer, made of germanium, formed on said first layer; and
    a third layer, made of a $Si_{1-x}Ge_x$ alloyed crystal (where $0<x<1$), formed on said second layer;
    wherein said first layer has a sufficiently large thickness, of at least 5000 Å, so as to impose a compressive strain on said second layer, such that a valence-band discontinuity between said strain-imposed second layer and the third layer is increased, as compared to a valence-band discontinuity between a layer of material of the second layer and a layer of material of the third layer in a case that no compressive strain is applied to the layer of material of the second layer.

14. A semiconductor device according to claim 13, wherein at least one of said first layer, said second layer and said third layer is doped with a p-type impurity.

15. A semiconductor device according to claim 13, wherein said second layer has a thickness of no more than 200 Å.

16. A semiconductor device according to claim 13, wherein said semiconductor device is a hetero-structure field effect transistor having a gate electrode, a source region and a drain region, and a gate insulating film;
    wherein said source region and said drain region are each formed in said third layer and said second layer;
    wherein said gate insulating film is formed on a surface region of said third layer between said source region and said drain region; and
    wherein said gate electrode is formed on said gate insulating film.

17. A semiconductor device according to claim 16, wherein said second layer provides a channel layer of said hetero-structure field transistor.

18. A field effect transistor, comprising:
    a substrate;
    a first layer, made of a $Si_{1-x_s}Ge_{x_s}$ alloyed crystal (where $0<x_s<1$), formed on said substrate;
    a second layer, made of germanium, formed on said first layer; and
    a third layer, made of a $Si_{1-x}Ge_x$ alloyed crystal (where $0<x<1$), formed on said second layer;
    a source region and a drain region, each of which is formed in said third layer and said second layer;
    a source electrode on said source region;
    a drain electrode on said drain region;
    a gate insulating film formed on a surface region of said third layer between said source region and said drain region; and
    a gate electrode on said gate insulating film;
    wherein said first layer has a sufficiently large thickness, of at least 5000 Å, so as to impose a compressive strain on said second layer, such that a valence-band discontinuity between said strain-imposed second layer and the third layer is increased, as compared to a valence-band discontinuity between a layer of material of the second layer and a layer of material of the third layer in a case that no compressive strain is applied to the layer of material of the second layer.

19. A field effect transistor according to claim 18, wherein said first layer is doped with a p-type impurity to form a modulation-doped field effect transistor.

20. A field effect transistor according to claim 18 wherein the second layer is doped with a p-type impurity to form a doped-channel field effect transistor.

21. A bipolar transistor comprising:
a substrate;
a collector layer, made of a $Si_{1-x_s}Ge_{x_s}$ alloyed crystal (where $0<x_s<1$), formed on said substrate;
a base layer, made of germanium, formed on said collector layer;
an emitter layer, made of a $Si_{1-x}Ge_x$ alloyed crystal (where $0<x<1$), formed on said base layer;
a collector electrode connected with said collector layer;
a base electrode connected with said base layer; and
an emitter electrode connected with said emitter layer;
wherein said collector layer has a sufficiently large thickness, of at least 5000 Å, so as to impose a compressive strain on said base layer, such that a valenced-band discontinuity between said strain-imposed base layer and said emitter layer is increased, as compared to a valence-band discontinuity between a layer of material of the base layer and a layer of material of the emitter layer in a case that no compressive strain is applied to the layer of material of the base layer.

22. A bipolar transistor according to claim 21, wherein said base layer is doped with a p-type impurity.

* * * * *